United States Patent [19]
Sato et al.

[11] Patent Number: 5,151,276
[45] Date of Patent: Sep. 29, 1992

[54] RESIN MOLDING APPARATUS

[75] Inventors: Mitsuo Sato, Zama; Hazime Shaura; Megumi Tateishi, both of Yokohama, all of Japan

[73] Assignee: Kabushiki Kaisha Toshiba, Kawasaki, Japan

[21] Appl. No.: 634,447

[22] Filed: Dec. 27, 1990

[30] Foreign Application Priority Data

Feb. 13, 1990 [JP] Japan .................... 2-31788

[51] Int. Cl.⁵ .................................. B29C 45/14
[52] U.S. Cl. ................................. 425/110; 264/134;
264/272.17; 264/328.9; 425/90; 425/129.1;
425/543; 425/547
[58] Field of Search ............... 425/110, 129.1, 90,
425/96, 98, 542, 543, 547; 264/134, 135, 272.17,
328.9, 328.12

[56] References Cited

U.S. PATENT DOCUMENTS

| | | | |
|---|---|---|---|
| 3,641,254 | 2/1972 | Bunting et al. | 264/272.17 X |
| 3,659,821 | 5/1972 | Sakamoto et al. | 264/272.17 X |
| 4,618,322 | 10/1986 | Lagasse | 425/543 X |
| 4,881,885 | 11/1989 | Kovac et al. | 264/272.17 X |

FOREIGN PATENT DOCUMENTS

| | | |
|---|---|---|
| 2937605A1 | 3/1981 | Fed. Rep. of Germany . |
| 54-33665 | 3/1979 | Japan .................... 264/272.17 |
| 59-64318 | 4/1984 | Japan . |
| 63-67126 | 3/1988 | Japan . |
| 63-67131 | 3/1988 | Japan . |
| 64-56516 | 3/1989 | Japan . |

Primary Examiner—Richard L. Chiesa
Attorney, Agent, or Firm—Foley & Lardner

[57] ABSTRACT

A resin molding apparatus for molding an insulating resin mold at the peripheral portion of a semiconductor wafer has an upper metallic mold, and a lower metallic mold which clamps the semiconductor wafer with the upper metallic mold. The upper and lower metallic molds form a resin space at the portion corresponding to the peripheral portion of the semiconductor wafer. The contact surfaces of the upper and lower metallic molds, which are in contact with the semiconductor wafer, and the inner surface of the resin space are coated with elastic material which does not adhere to the insulating resin.

12 Claims, 3 Drawing Sheets

RESIN MOLDING APPARATUS

BACKGROUND OF THE INVENTION

The present invention relates to a resin molding apparatus for molding an insulating resin mold at the peripheral portion of a semiconductor wafer.

A conventional resin molding apparatus for molding the insulating resin mold at the peripheral portion of the semiconductor wafer is known, and is provided with an upper mold and a lower mold which clamp the semiconductor wafer therebetween. A resin space to be filled with insulating resin is formed at the portion corresponding to the peripheral portion of the semiconductor wafer between the upper mold and the lower mold.

With the conventional resin molding apparatus, the upper and lower molds are made of metallic material such as stainless steel or resin material.

In the operation of the conventional apparatus, first the semiconductor wafer is clamped by pressure, between the upper mold and the lower mold, then the insulating resin is injected into the resin space. The insulating resin is cured by the upper and lower molds which have been previously heated.

As mentioned above, the upper and lower molds are made of metallic material such as stainless steel or resin material.

However, in the case that the upper and lower molds are made of metallic material, the mold release characteristic of the insulating resin deteriorates because the insulating resin adheres to the upper and lower molds. Accordingly, the problem of the lack of reliability of the molding process remains.

On the other hand, in the case that the upper and lower molds are made of resin material, the upper and lower molds become gradually deformed because the number of the clamping processes between the upper and lower molds is increased. Accordingly, the problem of upper and lower molds made of resin not being suitable for mass production still remains. It is required to exchange the upper and lower molds when they are deformed, and therefore the problem of high cost for their exchange remains.

SUMMARY OF THE INVENTION

It is an object of the present invention to provide a resin molding apparatus, in which the deformation of an upper mold and a lower mold is prevented and the mold release characteristic of the insulating resin is improved.

The foregoing object is accomplished by providing a resin molding apparatus for molding an insulating resin mold at the peripheral portion of a semiconductor wafer comprising; an upper metallic mold having an upper mold contact surface in contact with the semiconductor wafer, and a lower metallic mold having a lower mold contact surface in contact with the semiconductor wafer and for clamping the semiconductor wafer with the upper metallic mold, the upper and lower metallic molds forming a resin space to be filled with insulating resin at the portion corresponding to the peripheral portion of the semiconductor wafer, the upper mold contact surface, the lower mold contact surface and the inner surface of the resin space being coated with an elastic material which does not adhere to the insulating resin.

According to the present invention, as the upper mold contact surface, the lower mold contact surface, and the inner surface of the resin surface are coated with the elastic material which does not adhere to the insulating resin, the semiconductor wafer may be clamped elastically between the upper mold contact surface and the lower mold contact surface. Furthermore, the mold release characteristic of the insulating resin mold is improved.

DETAILED DESCRIPTION OF THE PREFERRED EMBODIMENTS

An embodiment of a resin molding apparatus of the present invention will become understood from the accompanying drawings, FIGS. 1-5.

Figure 1:
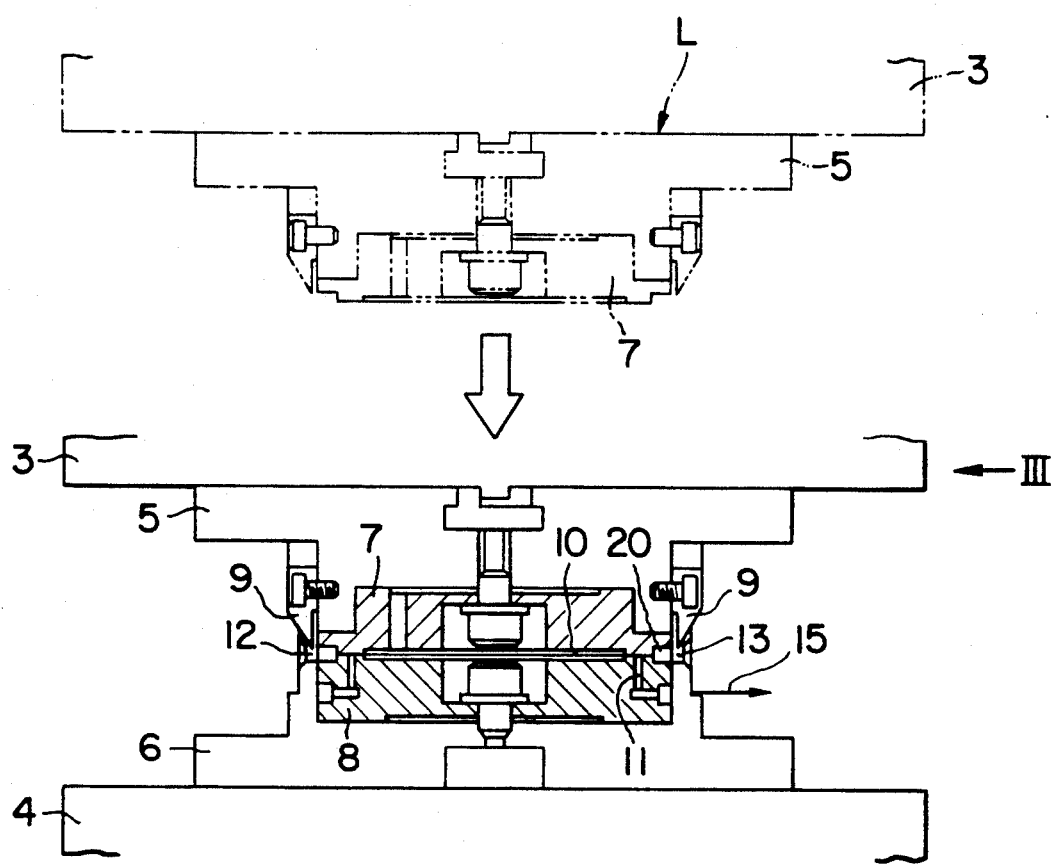
FIG. 1 is a sectional side view of a resin molding apparatus according to the present invention.

As shown in FIG. 1, the resin molding apparatus is provided with an upper mold 7 and a lower mold 8 which clamp a semiconductor wafer 10 therebetween. Both the upper mold 7 and the lower mold 8 are made of metallic material such as stainless steel. The lower mold 8 is mounted on a lower mold heat block 4 through a lower mold holder 6, on the other hand, the upper mold 7 is mounted on an upper mold heat block 3 through an upper mold holder 5. The lower mold heat block 4 is stable, and the upper mold heat block 3 is movable vertically.

A resin space 20 to be filled with insulating resin 20 such as silicon resin and the like is formed at the portion corresponding to the peripheral portion of the semiconductor wafer 10 between the upper mold 7 and the lower mold 8.

An injection port 12 for injecting insulating resin 2 into the resin space 20 and a discharge port 13 for discharging the insulating resin 2 out of the resin space 20, are formed at opposite sides of the upper mold holder 6. The injection port 12 and the discharge port 13 extend to the upper end of the upper mold holder 6. On the other hand, resin stoppers 9 are provided at opposite sides of the upper mold holder 5 so as to shut the upper portions of the injection port 12 and the discharge port 13.

Vacuum holes 11 are formed in the lower mold 8 so as to secure the semiconductor wafer 10 by vacuum drawing. The vacuum holes 11 communicate to a vacuum and high pressure line 15 which places the vacuum holes 11 in the vacuum condition or in the high pressure condition.

Figure 2:
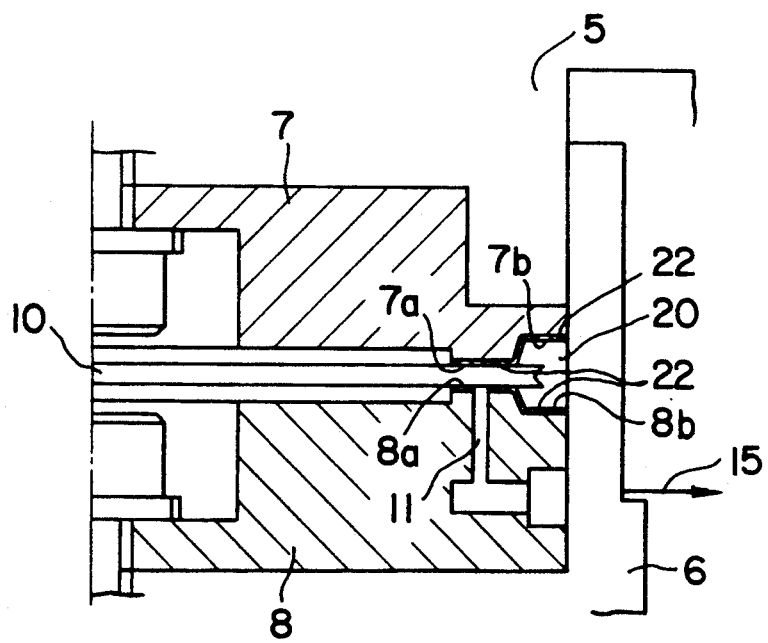
FIG. 2 is an expanded sectional view showing a resin space.
Figure 5:
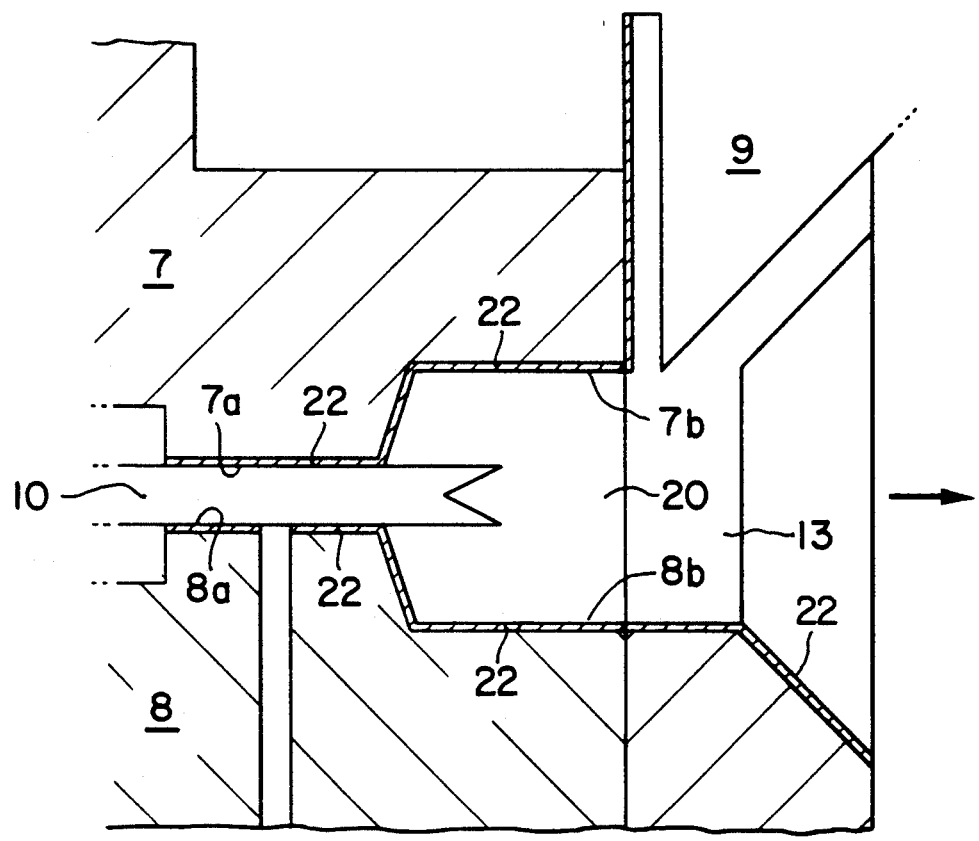
FIG. 5 is an enlarged view showing a resin space of FIG. 1.

As shown in FIGS. 2 and 5, an upper mold contact surface 7a of the upper mold 7 which comes into contact with the semiconductor wafer 10, and a lower mold contact surface 8a of the lower mold 8 which comes into contact with the semiconductor wafer 10 are coated with elastic material 22 such as trifluoride resin or tetrafluoride resin, which does not adhere to the insulating resin. A portion 7b of the upper mold 7 and a portion 8b of the lower mold 8 which form the resin space 20, are also coated with the elastic material 22 mentioned above. Furthermore, the inner surfaces of the injection port 12 and the discharge port 13 are coated with the elastic material 22.

The elastic material 22, as described above, does not adhere to the insulating resin such as silicon resin and the like, but comes into contact with the semiconductor wafer elastically.

The operation of the resin molding apparatus according to the present invention is as follows.

Figure 3:
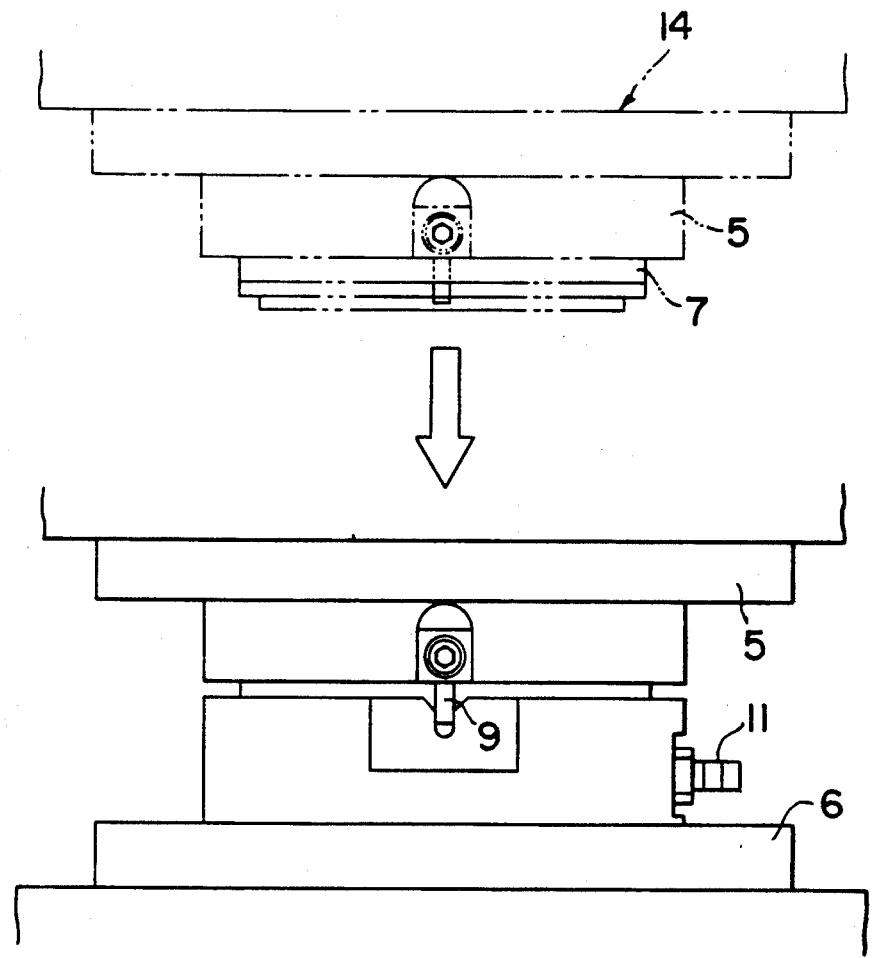
FIG. 3 is a side view taken in the direction of the arrow III of FIG. 1.

First, the upper mold heat block 3 is moved upward by a drive means (not shown) until the upper mold holder 5 is placed at an upper position L (a two-dot chain line position in FIGS. 1 and 3).

Next, the semiconductor wafer 10 is put on the lower mold 8, then the semiconductor wafer 10 is secured on the lower mold 8 by placing the vacuum holes 11 in the vacuum condition. Then the upper mold heat block 3 is moved downward, so that the semiconductor wafer 10 is clamped by pressure, between the upper mold 7 and the lower mold 8. In this case, as shown in FIG. 2, the upper mold holder 5 is inserted within the lower mold holder 6, whereby the outer surface of the resin space 20 is formed by the lower mold holder 6.

Next, the insulating resin 2 is injected into the resin space 20 through the injection port 12. Surplus insulating resin 2 in the resin space 20 is discharged through the discharge port 13. In this case, the upper mold 7 and the lower mold 8 have been previously heated by the upper mold heat block 3 and the lower mold heat block respectively. Then, the insulating resin 2 within the resin space 20 is cured by the heated upper and lower molds 7, 8, whereby an insulating resin mold 2 is formed at the peripheral portion of the semiconductor wafer 10.

After that, the upper mold heat block 3 is moved upward again, so that the upper mold 5 is separated from the lower mold 8. Then, the semiconductor wafer 10 having the insulating resin mold 2 is removed from the lower mold 8 by blowing high pressure air into the vacuum hole 11.

Figure 4:
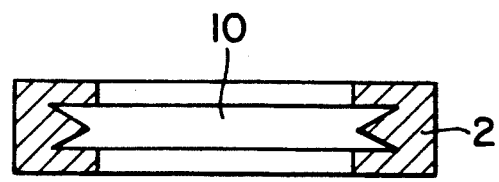
FIG. 4 is a side view showing a semiconductor wafer having an insulating resin mold at the peripheral portion thereof.

In this way, the semiconductor wafer 10 having the insulating resin mold 2 at the peripheral portion thereof is obtained, as shown in FIG. 4.

As mentioned above, according to the present invention, as the upper mold contact surface 7a of the upper mold 7 and the lower mold contact surface 8a of the lower mold 8 which is in contact with the semiconductor wafer 10 are coated with the elastic material 22, the semiconductor wafer 10 is held elastically between the upper mold contact surface 7a and the lower mold contact surface 8a without one side contact when the semiconductor wafer 10 is clamped. Accordingly, the breaking of the semiconductor wafer 10 is definitely prevented. As the portion 7b of the upper mold 7 and the portion 8b of the lower mold 8 which form the resin space 20 are coated with the elastic material 22 which does not adhere to the insulating resin 2, the mold release characteristic of the insulating resin mold 2 is improved. Furthermore, the adhesion of the insulating resin 2 to the upper mold 7 and the lower mold 8 is prevented.

As the inner surfaces of the injection port 12 and the discharge port 13 are coated with the elastic material 22, the adhesion of the insulating resin 2 to the inner surfaces of the injection port 12 and the discharge port 13 is also prevented. Furthermore, as both the upper mold 7 and the lower mold 8 are made of metallic material, their heat transfer rates are better when compared with those of resinoid molds made of resin material. Accordingly, the electric power required for heating the molds 7 and 8 is decreased, and the deformation of the molds 7 and 8 is prevented.

What is claimed is:

1. A resin molding apparatus for molding an insulating resin mold at the peripheral portion of a semiconductor wafer comprising:
   an upper metallic mold having an upper mold contact surface in contact with the semiconductor wafer,
   a lower metallic mold having a lower mold contact surface in contact with the semiconductor wafer, and for clamping the semiconductor wafer with the upper metallic mold, and
   first and second resin stoppers;
   wherein the upper lower metallic molds form a resin space therebetween which is to be filled with insulating resin through an injection port at the portion corresponding to the peripheral portion of the semiconductor wafer,
   the upper mold contact surface, the lower mold contact surface and the inner surface of the resin space are coated with an elastic material which does not adhere to the insulating resin;
   the resin space communicates with the outside environment through the injection port and a discharge port,
   the first resin stopper cooperates with the injection port to close an upper portion of the injection port, and the second resin stopper cooperates with the discharge port to close an upper portion of the discharge port.

2. The resin molding apparatus as claimed in claim 1, wherein
   the elastic material is trifluoride resin.

3. The resin molding apparatus as claimed in claim 1, wherein
   the elastic material is tetrafluoride resin.

4. The resin molding apparatus as claimed in claim 1, wherein
   the injection port and the discharge port each have inner surfaces which are coated with the elastic material.

5. The resin molding apparatus as claimed in claim 4, wherein
   the elastic material is trifluoride resin.

6. The resin molding apparatus as claimed in claim 4, wherein
   the elastic material is tetrafluoride resin.

7. A resin molding apparatus as claimed in claim 4, further comprising first and second mold holders which are connected to the upper and lower metallic molds, respectively.

8. A resin molding apparatus as claimed in claim 7, further comprising first and second heat blocks which are connected to said first and second mold holders, respectively.

9. A resin molding apparatus as claimed in claim 8, wherein the injection and discharge ports are formed in the second mold holder and extend to an upper surface of the second mold holder.

10. A resin molding apparatus as claimed in claim 9, wherein said first mold holder fits within said second mold holder such that the resin space is defined by the upper and lower metallic molds and the second mold holder.

11. A resin molding apparatus as claimed in claim 10, wherein the first and second resin stoppers are provided on the first mold holder.

12. A resin molding apparatus as claimed in claim 11, further comprising means for blowing high pressure air against the semiconductor wafer thereby dislodging the semiconductor wafer, from the lower metallic mold.

* * * * *